(12) United States Patent
Shimizu et al.

(10) Patent No.: US 9,204,562 B2
(45) Date of Patent: Dec. 1, 2015

(54) ELECTRICAL JUNCTION BOX

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Tatsuya Shimizu, Yokkaichi (JP); Takehiro Mizuno, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/377,216

(22) PCT Filed: Feb. 15, 2013

(86) PCT No.: PCT/JP2013/053642
§ 371 (c)(1),
(2) Date: Aug. 7, 2014

(87) PCT Pub. No.: WO2013/129131
PCT Pub. Date: Sep. 6, 2013

(65) Prior Publication Data
US 2015/0016076 A1 Jan. 15, 2015

(30) Foreign Application Priority Data
Feb. 27, 2012 (JP) ................................ 2012-039816

(51) Int. Cl.
*H02G 3/08* (2006.01)
*H05K 5/00* (2006.01)
(Continued)

(52) U.S. Cl.
CPC .......... *H05K 5/0056* (2013.01); *B60R 16/0238* (2013.01); *H02G 3/086* (2013.01); *H02G 3/16* (2013.01); *H05K 5/006* (2013.01); *H05K 5/0013* (2013.01)

(58) Field of Classification Search
CPC ........ H05K 7/026; H02G 3/086; H02G 3/088
USPC ............................. 361/679.01, 679.02; 174/50
See application file for complete search history.

(56) References Cited

U.S. PATENT DOCUMENTS 7,616,438 B2 * 11/2009 Shimizu ................. H05K 7/026
361/694
8,446,724 B2 * 5/2013 Shimizu ................... H02G 3/03
361/679.49
(Continued)

FOREIGN PATENT DOCUMENTS

JP U-63-59383 4/1988
JP U-3-81682 8/1991
(Continued)

OTHER PUBLICATIONS

International Search Report dated Mar. 12, 2013 from International Application No. PCT/JP2013/053642 (with English-language translation).

*Primary Examiner* — Adrian S Wilson
(74) *Attorney, Agent, or Firm* — Oliff PLC

(57) ABSTRACT

An electrical junction box includes a case that includes a bottom plate portion and a case-side peripheral wall portion, the case having an opening that opens to a lateral side, and a cover that closes the opening of the case and includes a lid plate portion and a cover-side peripheral wall portion covering a perimeter of the case-side peripheral wall portion. A protruding length of a second upper plate portion of the cover-side peripheral wall portion that is located on the upper side in a state in which the electrical junction box is used is set at such a length that the second upper plate portion protrudes slightly outward beyond an outer surface of the bottom plate portion.

2 Claims, 6 Drawing Sheets

(51) Int. Cl.
*H02G 3/16* (2006.01)
*B60R 16/023* (2006.01)

(56) References Cited

U.S. PATENT DOCUMENTS

| | | | | |
|---|---|---|---|---|
| 8,654,528 | B2* | 2/2014 | Hashikura | H05K 7/026 165/104.33 |
| 8,710,377 | B2* | 4/2014 | Hashikura | B60R 16/0238 174/520 |
| 8,973,753 | B2* | 3/2015 | Rayner | G06F 1/1626 206/305 |
| 2008/0119068 | A1* | 5/2008 | Shimizu | H05K 5/0208 439/76.2 |
| 2008/0157485 | A1* | 7/2008 | Isono | F16J 15/062 277/638 |
| 2009/0260844 | A1* | 10/2009 | Tseng | H05K 5/069 174/50.5 |
| 2010/0134975 | A1* | 6/2010 | Shimizu | H02G 3/03 361/694 |
| 2010/0181108 | A1* | 7/2010 | Hata | H05K 5/0213 174/548 |
| 2013/0027862 | A1* | 1/2013 | Rayner | G06F 1/1656 361/679.3 |
| 2015/0029686 | A1* | 1/2015 | Shimizu | H02G 3/16 361/752 |

FOREIGN PATENT DOCUMENTS

| | | |
|---|---|---|
| JP | A-2006-74988 | 3/2006 |
| JP | A-2006-351905 | 12/2006 |
| JP | A-2007-27395 | 2/2007 |
| JP | A-2009-111193 | 5/2009 |

* cited by examiner

ELECTRICAL JUNCTION BOX

BACKGROUND

The present application relates to an electrical junction box.

Conventionally, some of the electrical junction boxes that are disposed in submersible regions of engine compartments of automobiles are provided with a waterproof structure that prevents water from entering the inside of the electrical junction boxes (see JP 2006-74988A),

SUMMARY

Unlike the electrical junction boxes disposed in engine compartments and the like, electrical junction boxes that are disposed in passenger compartments do not require an advanced waterproof structure and require merely a water blocking structure that does not allow water to easily enter the inside even if a small amount of water such as a glass of water splashes onto the electrical junction boxes.

Applying an advanced waterproof structure as disclosed in the aforementioned document to such electrical junction boxes increases unnecessary cost, and therefore there is room for improvement.

The present application was made in view of the circumstances as described above, and it is an object thereof to provide an electrical junction box having a water blocking structure that suppresses entry of water to the inside of a case and resulting adhesion of water to a circuit structure at low cost.

The present application is directed to an electrical junction box including a case that includes a bottom plate portion and a case-side peripheral wall portion extending upright from a peripheral edge of the bottom plate portion, the case having an opening that opens to a lateral side, a circuit structure that is accommodated in the case, and a cover that closes the opening of the case and includes a lid plate portion and a cover-side peripheral wall portion extending upright from a peripheral edge of the lid plate portion and covering a perimeter of the case-side peripheral wall portion, wherein a protruding length of a cover-side upper wall portion of the cover-side peripheral wall portion that is located on an upper side in a state in which the electrical junction box is used is set at such a length that the cover-side upper wall portion protrudes outward beyond an outer surface of the bottom plate portion.

DETAILED DESCRIPTION

Figure 1:
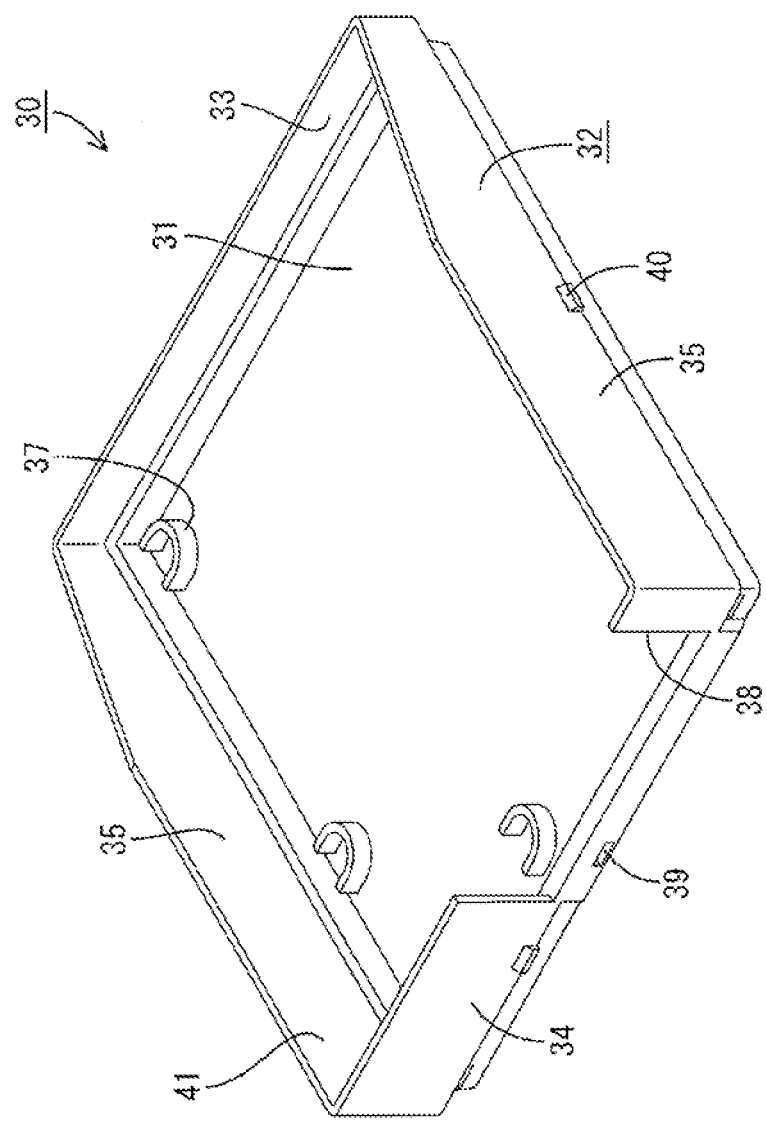
FIG. 1 is a perspective view of a case according to an embodiment.

In the electrical junction box of the application, the cover-side upper wall portion has the function of eaves, and therefore entry of water to a space between the case-side peripheral wall portion and the cover-side peripheral wall portion and advancement of that water to the inside can be suppressed.

The electrical junction box according to the present application more preferably has the following configurations in addition to the above-described configuration.

It is preferable that a step is formed in at least a case-side upper wall portion of the case-side peripheral wall portion that is located on the upper side in the state in which the electrical junction box is used such that a region of the case-side peripheral wall portion on the side of the opening protrudes outward beyond a region of the case-side peripheral wall portion on the side of the bottom plate portion.

With this configuration, even if water enters the space between the cover-side peripheral will portion and the case-side peripheral wall portion, that water is blocked by the step and drained to the outside without advancing further inside. Thus, it is possible to more reliably prevent water from entering and advancing further inside the space between the case-side peripheral wall portion and the cover-side peripheral wall portion.

Moreover, it is preferable that a sloping surface that slopes down toward the bottom plate portion is provided on an upper surface of the region of the case-side upper wall portion on the side of the bottom plate portion.

With this configuration, water that has entered the space between the cover-side upper wall portion and the case-side upper wall portion is even more readily drained to the outside. Thus, it is possible to more reliably prevent water from entering and advancing further inside the space between the case-side peripheral wall portion and the cover-side peripheral wall portion.

Furthermore, it is, preferable that in a state in which the cover and the case are assembled, the cover includes a waterproof wall protruding from the lid plate portion toward the case, the water proof wall being disposed at a position to the inside of the case-side upper wall portion and overhanging the circuit structure.

With this configuration, even if water enters the space between the cover-side upper wall portion and the case-side upper wall portion due to capillary action or the like and goes all the way to the inside of the case, that water is blocked by the waterproof wall. Thus, even if water enters the inside of the case, adhesion of that water to the circuit structure can be avoided.

Moreover, a water blocking structure as described above can be attained with a relatively small increase in cost as compared with a case structure with respect to which no countermeasure is taken. Thus, an electrical junction box having a water blocking structure can ho provided at low cost.

According to the present application, it is possible to provide an electrical junction box having a water blocking structure that suppresses entry of water into the inside of a case and resulting adhesion of water to a circuit structure at low cost.

Figure 2:
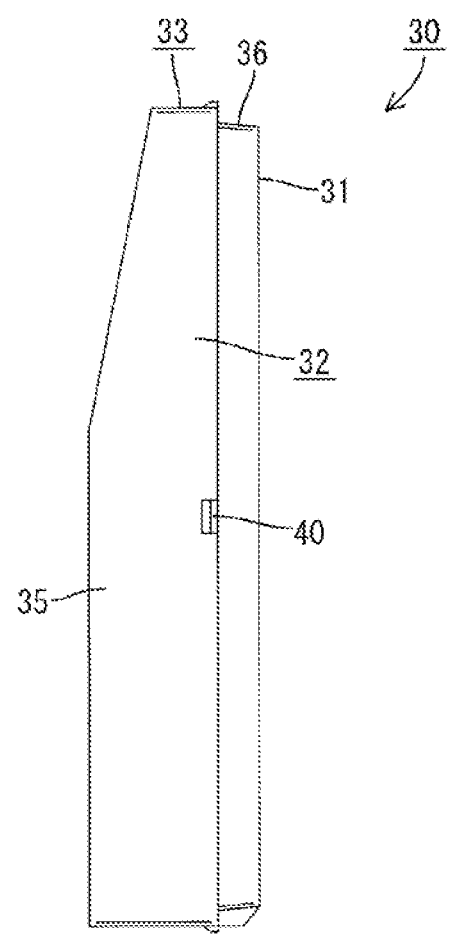
FIG. 2 is a side view of the case according to the embodiment.
Figure 3:
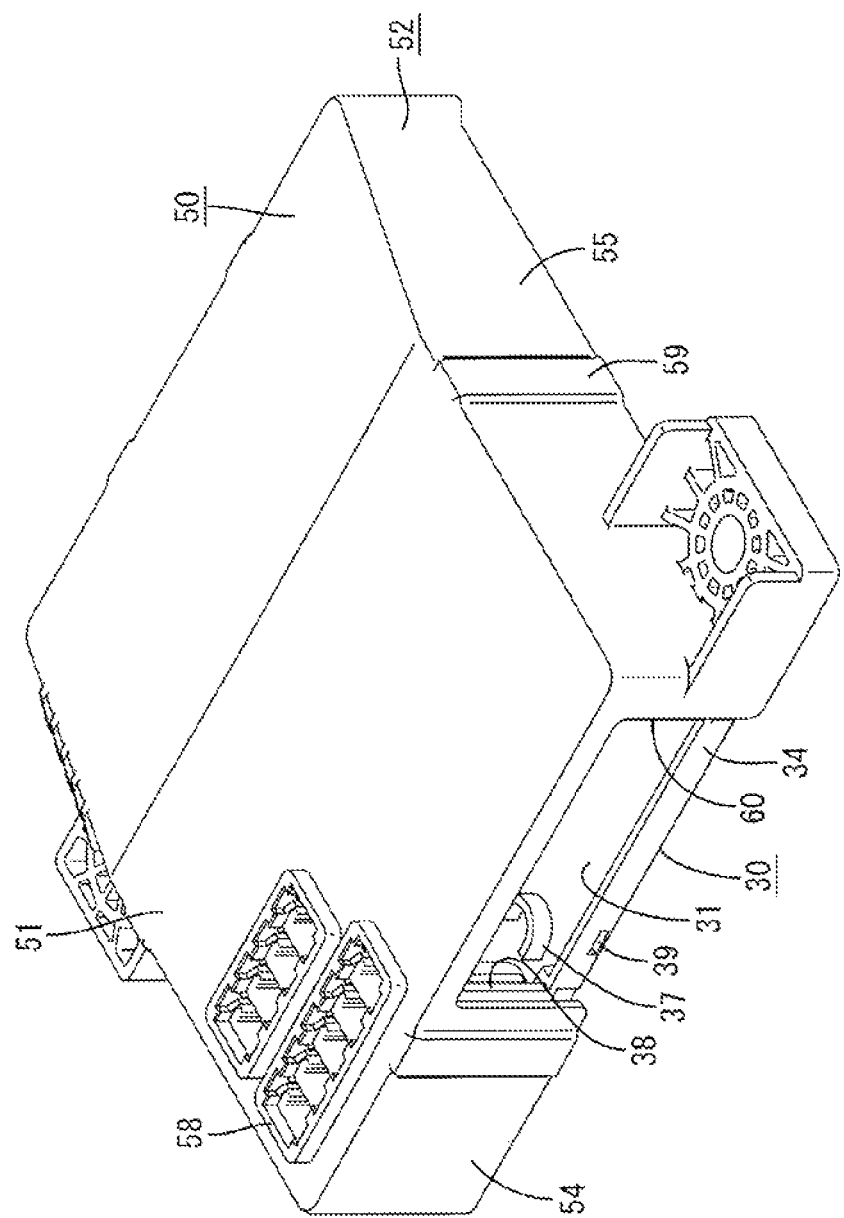
FIG. 3 is a perspective view showing a configuration in which the case and a cover according to the embodiment are assembled.
Figure 4:
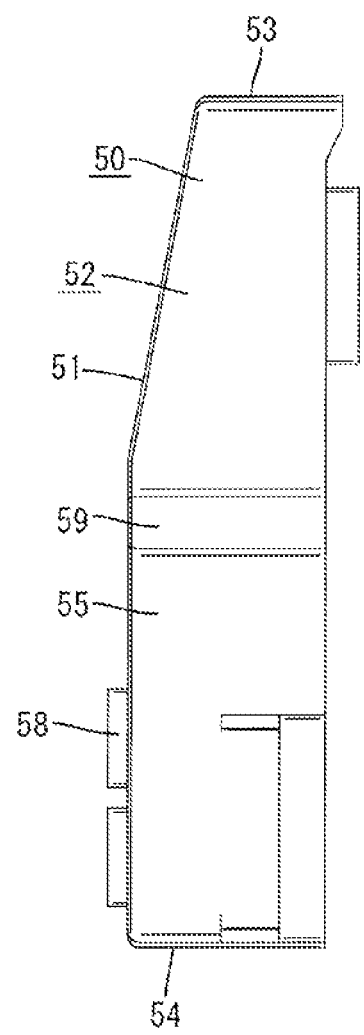
FIG. 4 is a side view of an electrical junction box according to the embodiment.
Figure 5:
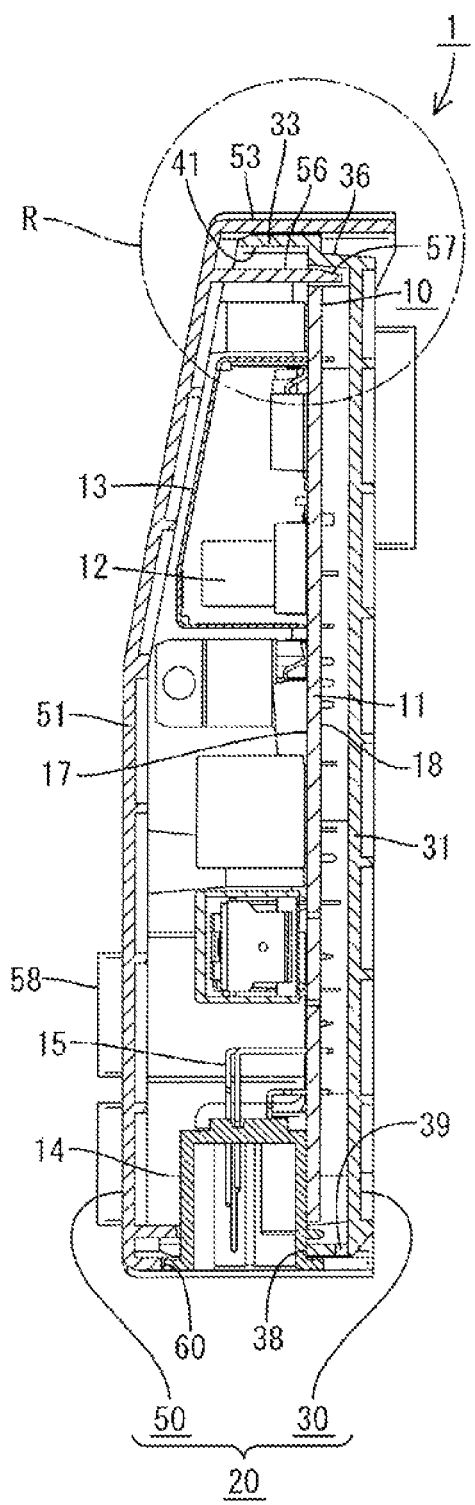
FIG. 5 is a cross-sectional view of the electrical junction box according to the embodiment.
Figure 6:
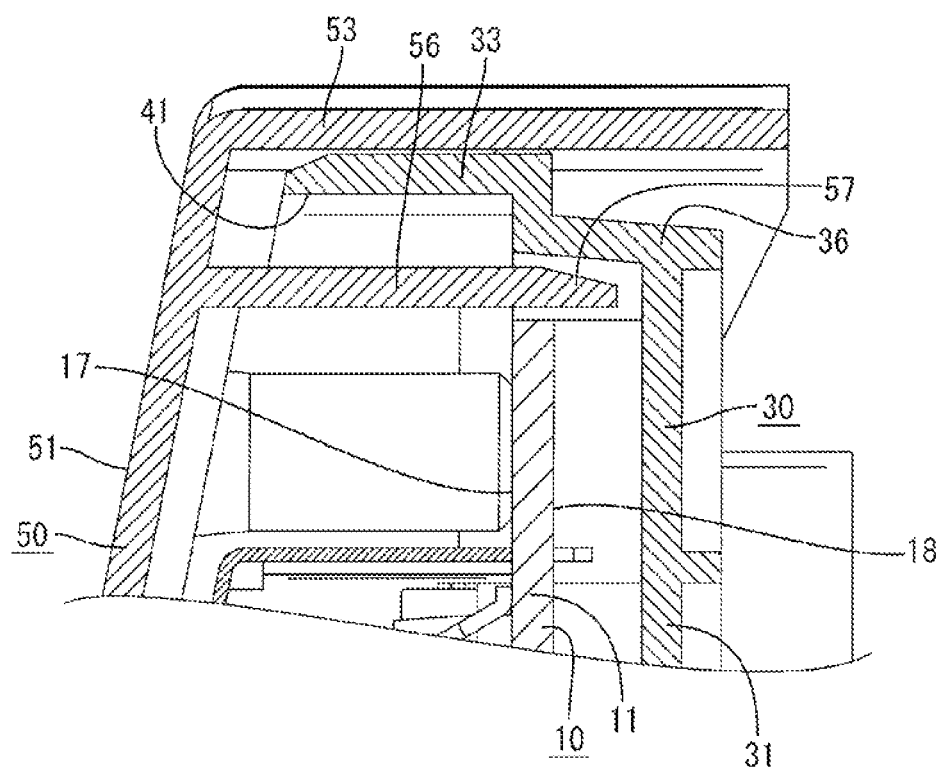
FIG. 6 is an enlarged view of a portion enclosed by circle R in FIG. 5.

Embodiment 1 of the present application will be described in detail with reference to FIGS. 1 to 6. An electrical junction box 1 according to this embodiment is installed in a passenger compartment of a vehicle and used, and includes a circuit structure 10 and a casing 20 that accommodates this circuit structure 10.

The circuit structure 10 includes a circuit board 11 including a conductor circuit (not shown) and electronic components 12 installed (mounted) on a front surface (mounting surface 17) of this circuit board 11. No electronic component 12 is installed. on a back surface (non-mounting surface 18) of the circuit board 11. Some electronic components 12 of the plurality of electronic components 12 that are installed on the circuit board 11 are covered by a shield shell 13 made of a metal. Electronic components that generate radiation noise are disposed in an upper region of the mounting surface 17 of the circuit board 11, the region constituting about one-third of the mounting surface 17, and electronic components that do not generate radiation noise are disposed below that region. The shield shell 13 covers the upper region constituting about one-third of the mounting surface 17 of the circuit board 11.

A connector fitting portion 14 into which a counterpart connector that is connected to a power supply or on-vehicle electrical equipment can be fitted is formed in a certain region in a lower portion of the front surface of the circuit board 11 such that the connector fitting portion 14 opens downward. Connecting terminals 15 that are electrically connected to the conductor circuit provided in the circuit board 11 are exposed inside the connector fitting portion 14. Also, fuse terminals (not shown) that are electrically connected to the conductor circuit are disposed in another region in the lower portion of the front surface of the circuit board 11.

This circuit structure 10 is accommodated in the casing 20 in a portrait orientation, that is, in such an orientation that the direction in which a board surface of the circuit board 11 extends is a longitudinal direction.

The casing 20 is made of a synthetic resin, and includes a case 30 that accommodates the circuit structure 10 and a cover 50 that is attached to the case 30 so as to close an opening 41 of the case 30. The case 30 is formed in the shape of a flat box whose lateral side is open, and the circuit structure 10 is accommodated in the case 30 such that the side of the mounting surface 17 (the side on which the electronic components 12 are mounted) faces the opening 41. The case 30 includes a bottom plate portion 31 that is formed a rectangular shape slightly larger than the circuit structure 10 and a case-side peripheral wall portion 32 that extends upright from a peripheral edge of the bottom plate portion 31. The case-side peripheral wall portion 32 includes a first upper plate portion 33 (corresponding to a case-side upper wall portion), a first lower plate portion 34, and first side plate portions 35, which are located on the upper side, the lower side, and the left and right sides, respectively, in a state in which the electrical junction box 1 is disposed in a vehicle and used.

In the case-side peripheral will portion 82, as step is formed that extends over the entire widths of the first upper plate portion 33 and the first side plate portions 35 and a portion of the first lower plate portion 34 excluding the position in which a case-side connector opening 38 (described later) is formed. That is to say, with respect to the entire widths of the first upper plate portion 33 and the first side plate portions 35 and the portion of the first lower plate portion 34 excluding the position in which the case-side connector opening 38 is formed, the case-side peripheral wall portion 32 is shaped such that it extends from the peripheral edge of the bottom plate portion 31 toward the front side (toward the opening 41), then further extends outward from an end of the extension, and yet further extends toward the front side from an end of the outward extension, and thus the step is formed such that a region of the case-side peripheral wall portion 32 on the side of the opening 41 protrudes outward beyond a region thereof on the side of the bottom plate portion 31. It should be noted that in the first upper plate portion 33, an upper surface of the lower region (region on the side of the bottom plate portion 31) serves as a first sloping surface 86 (corresponding to a sloping surface) that slopes down toward the bottom plate portion 31 over the entire width of the first upper plate portion 33.

A plurality of support protrusions 37 are provided so as to protrude from an inner surface of the bottom plate portion 31, the support protrusions 37 being provided to support the circuit structure 10 in a state in which a space is left between the circuit structure 37 and this inner surface. The height of the support. protrusions 37 is set to be lower than the height of the step surface of the case-side peripheral wall portion 32 from the bottom plate portion 31 by the thickness of the circuit board 11, and the circuit structure 10 is accommodated in the case 30 in a state in which this step surface and the surface of the circuit board 11 are at substantially the same height.

The case-side connector opening 38 for exposing the connector fitting portion 14 of the circuit structure 10 to the outside is formed in the first lower plate portion 34. The case-side connector opening 38 is formed by cutting out a portion of the first lower plate portion 34 that is in alignment with the connector fitting portion 14 of the circuit structure 10, the portion spanning from an edge portion of the first lower plate portion 34 on the side of the opening 41 to a certain depth. Also, in the first lower plate portion 34, a drain hole 39 for allowing water that has entered the inside of the case 30 to drain is provided in a region between the position at which the first lower plate portion 34 is joined to the bottom plate portion 31 and the portion where the case-side connector opening 38 is formed such that the drain hole 39 passes through the first lower plate portion 34 in a vertical direction.

Locking protrusions 40 for locking the cover 50 are provided on outer surfaces of the first upper plate portion 33, the first lower plate portion 34, and the first side plate portions 35.

The cover 50 is attached to the case 30 from the front side so that the cover 50 closes the opening 41 of the case 30. The cover 50 has the shape of a flat box whose back side is open, and includes a lid plate portion 51 having the shape of a substantially rectangular plate that is slightly larger than the bottom plate portion 31 of the case 30, and a cover-side peripheral wall portion 52 extending upright from a peripheral edge of the lid plate portion 51. The cover-side peripheral wall portion 52 is formed in the shape of a rectangular frame that is slightly larger than the case-side peripheral wall portion 32 such that, in a state in which the case 30 and the cover 50 are assembled, the cover-side peripheral wall portion 52 covers the outer perimeter of the case-side peripheral wall portion 32. The cover-side peripheral wall portion 52 includes a second upper plate portion 53 (corresponding to a cover-side upper wall portion), a second lower plate portion 54, and second side plate portions 55, which are located on the upper side, the lower side, and the left and right sides, respectively, in a state in which the electrical junction box 1 is disposed in the vehicle and used.

The protruding length of the second upper plate portion 53 of the cover-side peripheral wall portion 52 is set at such a length that, in a state in which the cover 50 and the case 30 are assembled, a protruding end of the second upper plate portion 53 is located slightly further outward than the outer surface of the bottom plate portion 31, and the protruding lengths of the second tower plate portion 54 and the second side plate portions 55 are set at such lengths that, in the state in which the cover 50 and the case 30 are assembled, protruding ends of those portions are positioned substantially flush with the outer surface of the bottom plate portion 31.

Furthermore, a third upper plate portion 56 (corresponding to a waterproof wall) is provided so as to protrude from an inner surface of the lid plate portion 51. The third upper plate portion 56 is provided so as to extend upright at a position to the inside of (below) the second upper plate portion 53 with just enough space to receive the first upper plate portion 33 of the case-side peripheral wall portion 32 being left between the ascend upper plate portion 53 and the third upper plate portion 56. Thus, in a state in which the case 30 and the cover 50 are assembled, the first upper plate portion 33 can be received between the second upper plate portion 53 and the third upper plate portion 56.

The third upper plate portion 56 is located slightly above an upper end of the circuit structure 10, and its protruding length is set at such a length that, in a state in which the circuit structure 10 is accommodated in the casing 20, a protruding end of the third upper plate portion 56 is positioned slightly closer to the bottom plate portion 31 than the non-mounting surface 18 of the circuit board 11 is, and closer to the lid plate portion 51 than the inner surface of the bottom plate portion 31 of the case 30 is, while being spaced apart from the inner surface by a small distance.

A region of the third upper plate portion 56 that spans from its protruding end to a position that is slightly shifted toward the lid plate portion 51 from the protruding end serves as a second sloping surface 57 that slopes down toward the protruding end (the side of the bottom plate portion 31) over the entire width of the third upper plate region 56.

A fuse attachment portion 58 to which fuses can be attached is formed in a lower portion of a front surface of the lid plate portion 51 such that the fuse attachment portion 58 opens to the front side. The fuse terminals provided in the circuit structure 10 are exposed inside the fuse attachment portion 58.

A plurality of lock receiving portions 59 that engage with the locking protrusions 40 of the case 30 are provided on inner surfaces of the second upper plate portion 53, the second lower plate portion 54, and the second side plate portions 55.

In the second lower plate portion 54, a cover-side connector opening 60 is formed at a position that is in alignment with the case-side connector opening 38. The cover-side connector opening 60 is formed by cutting out a portion of the second lower plate portion 54 that is in alignment with the connector fitting portion 14 of the circuit structure 10, the portion spanning from an opening-side edge portion of the second lower plate portion 54 to a certain depth. Thus, the connector fitting portion 14 of the circuit structure 10 is exposed to the outside from the cover side connector opening 60 via the case-side connector opening 38. It should be noted that the drain hole 39, which is formed in the first lower plate portion 34, is also exposed to the outside from this cover-side connector opening 60.

Next, procedures for assembling the case 30, the cover 50, and the circuit structure 10 that are configured as described above will be described.

First, the circuit structure 10 is accommodated in the case 30 such that the mounting surface 17 (surface on which the electronic components 12 are installed) faces the opening 41 of the case 30, and the non-mounting surface 18 faces the bottom plate portion 31. At this time, the circuit structure 10 rests on the support protrusions 37, so that a space serving as a water passage is secured between the non-mounting surface 18 of the circuit structure 10 and the inner surface of the bottom plate portion 31.

Next, the cover 50 is attached from the opening side of the case 30. At this time, the first upper plate portion 33 of the case 30 is inserted between the second upper plate portion 53 and the third upper plate portion 56 of the cover 50. Then, the locking protrusions 40 and the lock receiving portions 59 engage, thereby bringing the case 30 and the cover 50 into engagement with each other.

The assembled electrical junction box 1 is installed, for example, at a predetermined position in the vehicle, that is, in the passenger compartment of the vehicle in an orientation in which the first upper plate portion 33, the second upper plate portion 53, and the third upper plate portion 53 face upward, and the circuit structure 10, which is accommodated in the electrical junction box 1, is in a portrait position, and used.

Next, the effects of this embodiment will be described.

The electrical junction box 1 according to this embodiment is installed in the passenger compartment of a vehicle, that is, a location where it is basically protected from the rain, wash water used in vehicle washing, and the like, but a case is conceivable in which a small amount of water splashes onto the electrical junction box 1 when, for example, a passenger spills water in the passenger compartment.

Here, the electrical junction box 1 according to this embodiment includes the case 30 that includes the bottom plate, portion 31 and the case-side peripheral wall portion 32 extending upright from the peripheral edge of the bottom plate portion 31 and opens to the lateral side, and the cover 50 that closes the opening 41 of the case 30 and includes the lid plate portion 51 and the cover-side peripheral wall portion 52 extending upright from the peripheral edge of the lid plate portion 51 and covering the perimeter of the case-side peripheral wall portion 32, and the protruding length of the second upper plate portion 53 of the cover-side peripheral wall portion 52 is set at such a length that the second upper plate portion 53 protrudes slightly outward beyond the outer surface of the bottom plate portion 31.

With this configuration, the second upper plate portion 53 has the function of eaves, so that most of water splashing on the electrical junction box 1 falls downward without entering the inside of the electrical junction box 1 through the space between the case-side peripheral wall portion 32 and the cover-side peripheral wall portion 52. Thus, entry of water to the inside through the space between the case-side peripheral wall portion 32 and the cover-side peripheral wall portion 52 can be suppressed.

Moreover, the step is formed in the first upper plate portion 33, the first lower plate portion 34, and the first side plate portions 35 of the case 30 such that the region of those portions on the side of the opening 41 protrudes outward beyond the region of those portions on the side of the bottom plate portion 31.

With this configuration, even if water enters the space between the case-side peripheral wall portion 32 and the cover-side peripheral wall portion 52, that water is blocked by the step and drained to the outside without advancing further inside. Therefore, entry of water to the inside through the space between the case-side peripheral wall portion 32 and the cover-side peripheral wall portion 52 can be more reliably prevented.

In particular, the upper surface of the lower region (region on the side of the bottom plate portion 31) of the first upper plate portion 33 serves as the first sloping surface 36 that slopes down toward the bottom plate portion 31.

With this configuration, water that has entered the space between the second upper plate portion 53 of the cover 50 and the first upper plate portion 33 of the case 30 flows down toward the bottom plate portion 31 in accordance with the slope of the first sloping surface 36, and is therefore even more readily drained to the outside. Therefore, water can be mere reliably prevented from entering and advancing further inside the space between the second upper plate portion 53 and the first upper plate portion 33 of the case 30.

Furthermore, the cover 50 includes the third upper plate portion 56, which protrudes from the lid plate portion 51 toward the case 30 and which, in a state in which the cover 50 and the case 30 are assembled, is disposed at a position to the inside of (below) the first upper plate portion 33 and overhangs the circuit structure 10.

With this configuration, even if water enters the space between the upper region (region on the side of the opening) of the first upper plate portion 33 and the second upper plate portion 53 due to capillary action or the like and goes all the way to the inside of the first upper plate portion 33, that water is blocked by the third upper plate portion 56. Thus, even if water enters the inside of the case 30, adhesion of that water to the circuit structure 10 can be avoided.

Also, a water blocking structure as described above can be attained with a relatively small increase in the cost as compared with a case structure with respect to which no countermeasure is taken. For this reason, the electrical junction box 1 having a water blocking structure can be provided at low cost.

The present application is not limited to the foregoing description and the embodiment that has been described using the drawings, and, for example, embodiments as described below are also embraced within the technical scope of the present application.

(1) In the foregoing embodiment, the step that is formed in the case-side peripheral wall portion 32 extends over its substantially entire perimeter excluding the position in which the case-side connector opening 38 is formed. However, it is sufficient if a step is formed in at least the first upper plate portion of the case-side peripheral wall portion that is located on the upper side in a state in which the electrical junction box is installed and used.

(2) In the foregoing embodiment, the entire upper surface of the lower region (region on the side of the bottom plate portion 31) of the first upper plate portion 33 serves as the first sloping surface 36 that slopes down toward the bottom plate portion 31. However, it is also possible that the sloping surface is provided in only a certain region of the upper surface of the case-side upper wall portion that is near the protruding end. Also, in the foregoing embodiment, the first sloping surface 36 is provided over the entire width of the first upper plate portion 33. However, it is also possible that the first sloping surface 36 is provided in only a portion of the first upper plate portion 33 with respect to its width direction.

The invention claimed is:

1. An electrical junction box comprising:
a case that comprises a bottom plate portion and a ease-side peripheral wall portion extending upright from a peripheral edge of the bottom plate portion, the case having an opening that opens to a lateral side; a circuit structure that is accommodated in the case; and a cover that closes the opening of the case and comprises a lid plate portion and a cover-side peripheral wall portion extending upright from a peripheral edge of the lid plate portion and covering a perimeter of the case-side peripheral wall portion,
wherein a protruding length of a cover-side upper wall portion of the cover-side peripheral wall portion that is located on an upper side in a state in which the electrical junction box is used is set at such a length that the cover-side upper wall portion protrudes outward beyond an outer surface of the bottom plate portion,
a step is formed in an outer surface and an inner surface of at least a case-side upper wall portion of the case-side peripheral wall portion that is located on the upper side in the state in which the electrical junction box is used such that a region of the case-side peripheral wall portion on the side of the opening protrudes outward beyond a region of the case-side peripheral wall portion on the side of the bottom plate portion,
in a state in which the cover and the case are assembled, the cover comprises a waterproof wall protruding from the lid plate portion toward the case, the waterproof wall being disposed at a position to the inside of the case-side upper will portion and overhanging the circuit structure, and
the waterproof wall is disposed below the step that is formed in the inner surface of the case-side upper wall portion.

2. The electrical junction box according to claim 1,
wherein a sloping surface that slopes down toward the bottom plate portion is provided on an upper surface of the region of the case-side upper wall portion on the side of the bottom plate portion.

* * * * *